(12) United States Patent
Tomioka et al.

(10) Patent No.: US 10,459,264 B2
(45) Date of Patent: Oct. 29, 2019

(54) DISPLAY DEVICE

(71) Applicant: Japan Display Inc., Minato-ku (JP)

(72) Inventors: Yasushi Tomioka, Tokyo (JP); Hajime Yamaguchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 143 days.

(21) Appl. No.: 15/628,972

(22) Filed: Jun. 21, 2017

(65) Prior Publication Data

US 2017/0371194 A1 Dec. 28, 2017

(30) Foreign Application Priority Data

Jun. 24, 2016 (JP) .................. 2016-125585

(51) Int. Cl.
| | |
|---|---|
| *G02F 1/1333* | (2006.01) |
| *H01L 27/12* | (2006.01) |
| *H01L 27/32* | (2006.01) |
| *H01L 51/00* | (2006.01) |
| *H01L 51/52* | (2006.01) |
| *H05K 1/18* | (2006.01) |
| *H01L 23/498* | (2006.01) |
| *H05K 1/02* | (2006.01) |
| *H05K 1/14* | (2006.01) |
| *H05K 3/32* | (2006.01) |
| *H05K 3/36* | (2006.01) |

(52) U.S. Cl.
CPC ...... *G02F 1/133305* (2013.01); *H01L 27/124* (2013.01); *H01L 27/1218* (2013.01); *H01L 27/3276* (2013.01); *H01L 51/0097* (2013.01); *H01L 51/5253* (2013.01); *H05K 1/189* (2013.01); *H01L 23/4985* (2013.01); *H01L 2251/5338* (2013.01); *H01L 2251/558* (2013.01); *H05K 1/0281* (2013.01); *H05K 1/147* (2013.01); *H05K 3/323* (2013.01); *H05K 3/361* (2013.01); *H05K 2201/10128* (2013.01); *Y02E 10/549* (2013.01)

(58) Field of Classification Search
CPC .................... G02F 1/13305; H01L 27/3276
USPC ...................... 345/76, 214; 257/72
See application file for complete search history.

(56) References Cited

U.S. PATENT DOCUMENTS

| | | | |
|---|---|---|---|
| 2009/0256154 A1* | 10/2009 | Lee ................... | H01L 29/78603 257/66 |
| 2014/0138637 A1* | 5/2014 | Yang .................. | H01L 27/1218 257/40 |
| 2014/0353670 A1 | 12/2014 | Youn et al. | |
| 2015/0287750 A1 | 10/2015 | Youn et al. | |
| 2016/0035759 A1* | 2/2016 | Kwon ................ | H01L 27/1244 257/40 |

* cited by examiner

FOREIGN PATENT DOCUMENTS

JP 2014-232300 12/2014

*Primary Examiner* — Calvin C Ma
(74) *Attorney, Agent, or Firm* — Oblon, McClelland, Maier & Neustadt, L.L.P.

(57) ABSTRACT

According to one embodiment, a display device includes a first substrate including a first area and a second area, the first area including a display area where pixels are arranged, and the second area being adjacent to the first area and where wirings are arranged, wherein the wirings are covered with a protection layer, the second area includes a peripheral area and a central area in an arrangement direction of the wirings, and a thickness of at least one of the first substrate and the protection layer varies between the peripheral area and the central area.

18 Claims, 14 Drawing Sheets

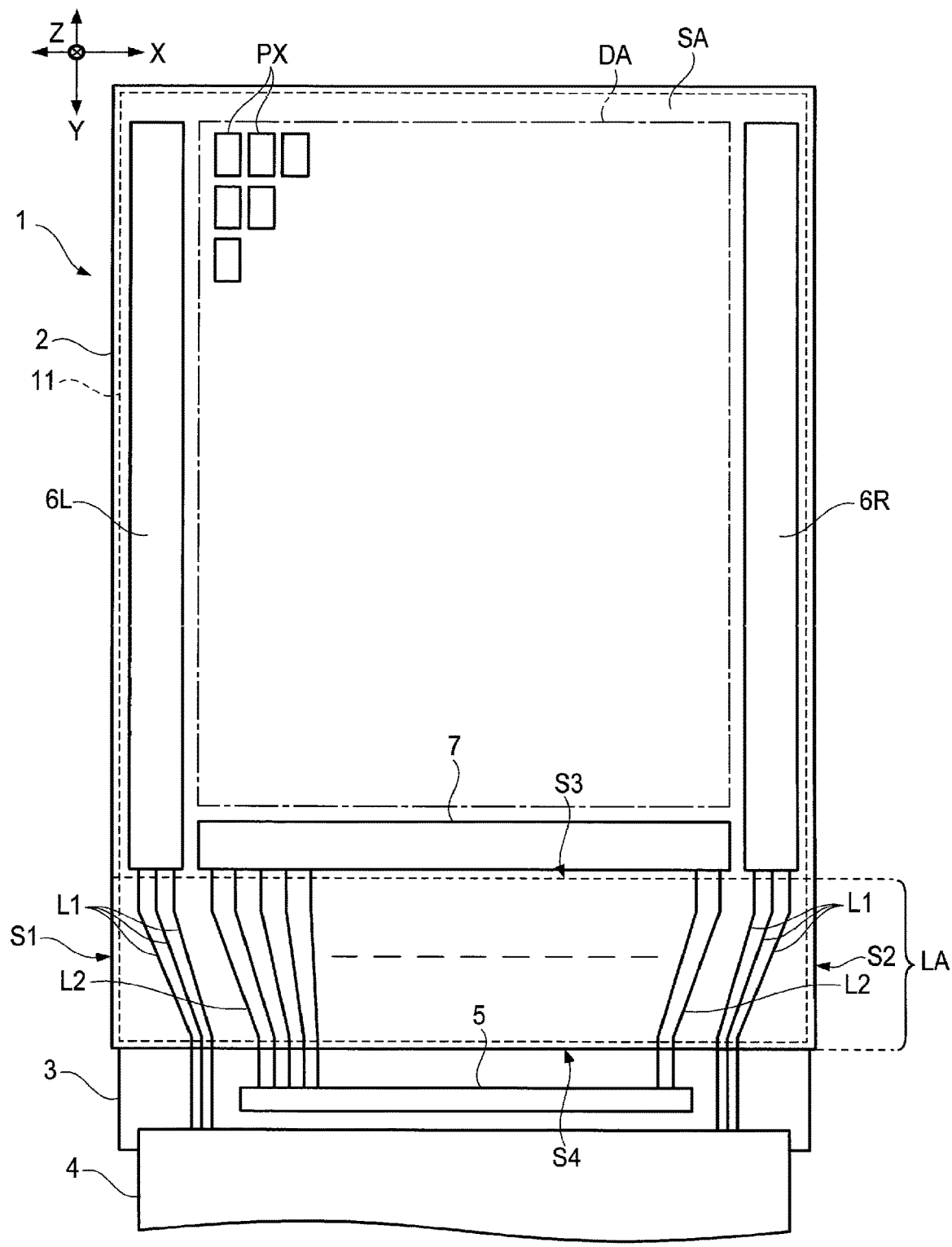
F I G. 1

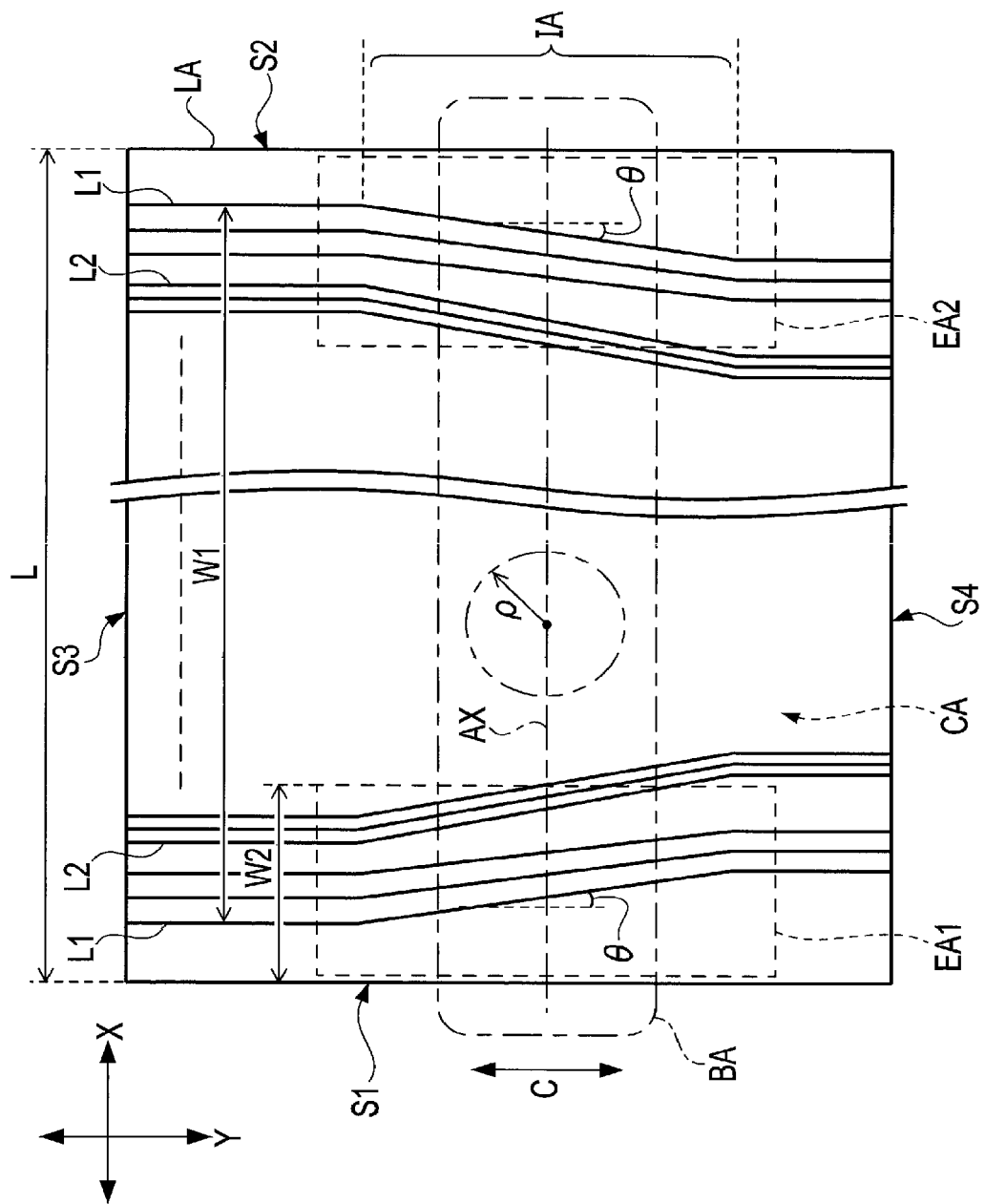
F I G. 3

| Layer structure | | Film thickness (μm) | Young's modulus (GPa) |
|---|---|---|---|
| Reinforcement layer 22 | Acrylic resin | 3 | 0.6 |
| Protection layer 21 | Acrylic resin | 60 | 0.6 |
| Passivation layer | Inorganic film | 0.2 | 100 |
| Conductive line layer 30 | Ti | 0.05 | 107 |
| | Al | 0.5 | 70.3 |
| | Ti | 0.1 | 107 |
| Passivation layer | Inorganic film | 0.5 | 100 |
| Flexible substrate 11 | Polyimide film | 15 | 8 |

F I G. 10

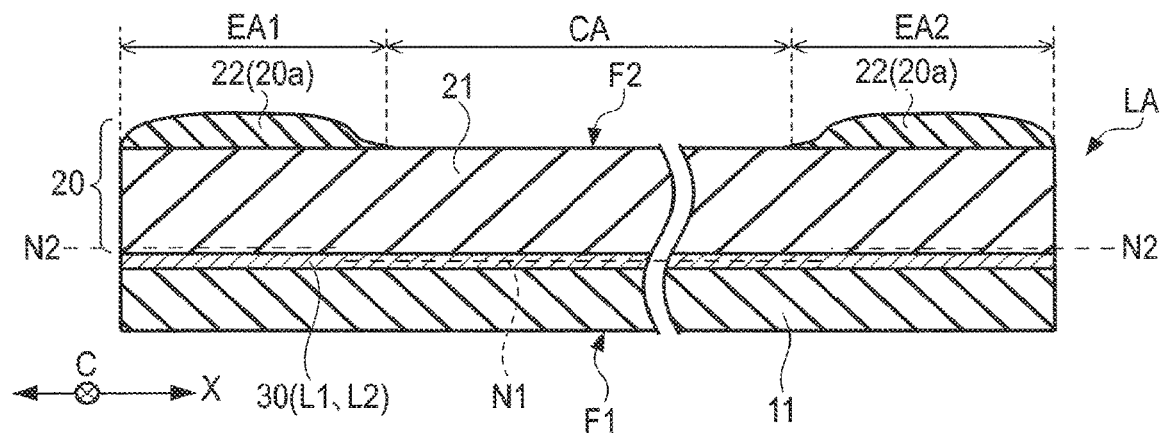
F I G. 11
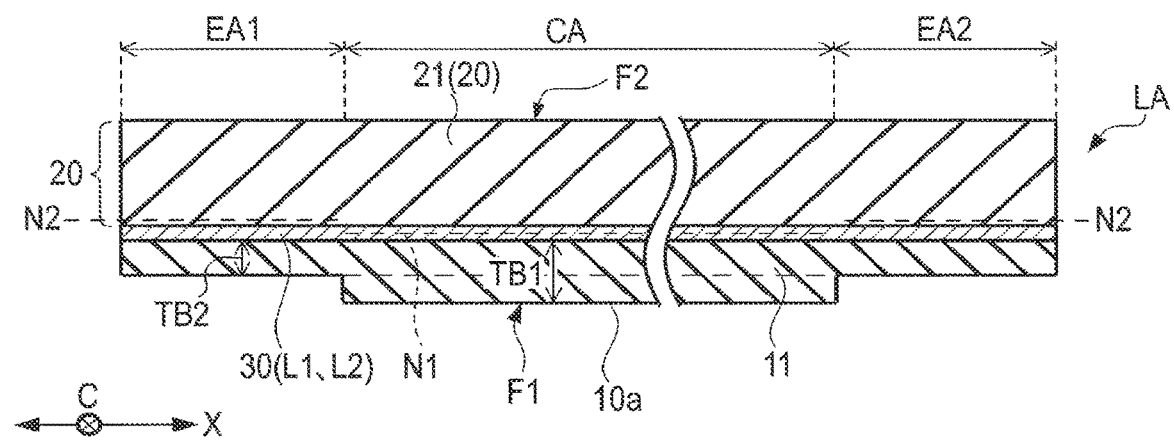
F I G. 12

| Layer structure | | Film thickness (μm) | Young's modulus (GPa) |
|---|---|---|---|
| Protection layer 21 | Acrylic resin | 60 | 0.6 |
| Passivation layer | Inorganic film | 0.2 | 100 |
| Conductive line layer 30 | Ti | 0.05 | 107 |
| | Al | 0.5 | 70.3 |
| | Ti | 0.1 | 107 |
| Passivation layer | Inorganic film | 0.5 | 100 |
| Flexible substrate 11 | Polyimide film | 15→14 | 8 |

F I G. 14

DISPLAY DEVICE

CROSS-REFERENCE TO RELATED APPLICATIONS

This application is based upon and claims the benefit of priority from Japanese Patent Application No. 2016-125585, filed Jun. 24, 2016, the entire contents of which are incorporated herein by reference.

FIELD

Embodiments described herein relate generally to a display device.

BACKGROUND

Conventionally, in a display device such as an organic electroluminescent display device or a liquid crystal display device, a glass substrate is used as the base of a display panel. Recently, a flexible display device in which a resin substrate such as a polyimide resin substrate is used as the base of a display panel and flexibility is given to the display panel has been developed.

For example, in such a flexible display device, it is possible to reduce the size of a frame by bending toward a display area, a wiring area in which various wirings are formed outside the display area. In this case, however, the wirings are at risk of being damaged by stress resulting from the bending.

BRIEF DESCRIPTION OF THE DRAWINGS

FIG. 1 is a schematic plan view of a display device.

FIG. 3 is a plan view of an example of the wiring area.

FIG. 10 is a table showing a layer structure of Example 1 of the first embodiment.

FIG. 11 is a diagram showing a modification of the first embodiment.

FIG. 12 is a sectional view of a wiring area of a second embodiment.

FIG. 14 is a table showing a layer structure of Example 2 of the second embodiment.

DETAILED DESCRIPTION

Figure 2:
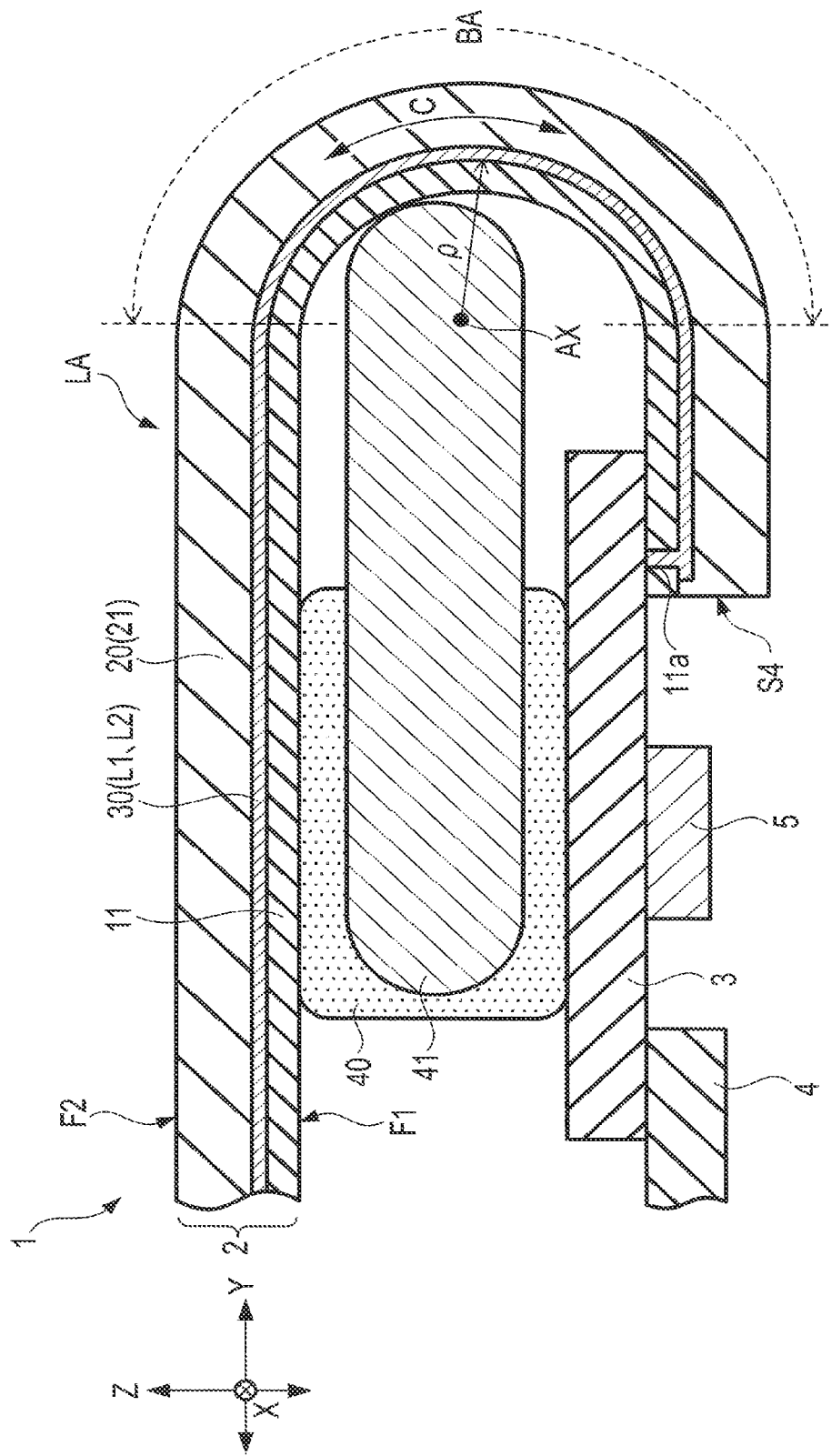
FIG. 2 is a diagram showing a state where a wiring area of the display device is folded.

In general, a display device according to one embodiment includes a first substrate including a first area and a second area, the first area including a display area where pixels are arranged, the second area being adjacent to the first area and where wirings are arranged, wherein the wirings are covered with a protection layer, the second area includes a peripheral area and a central area in an arrangement direction of the wirings, and a thickness of at least one of the first substrate and the protection layer varies between the peripheral area and the central area.

Further, in a display device according to another embodiment, a Young's modulus of the protection layer varies between the peripheral area and the central area.

According to these structures, it is possible to prevent the damage of the wirings caused by the bending of the second area and improve the reliability of the display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the respective parts are illustrated in the drawings schematically, rather than as an accurate representation of what is implemented. However, such schematic illustration is merely exemplary and in no way restricts the interpretation of the invention. In the drawings, reference numbers of continuously arranged elements equivalent or similar to each other are omitted in some cases. In addition, in the specification and drawings, structural elements equivalent or similar to those described in connection with preceding drawings are denoted by the same reference numbers, and detailed description thereof is omitted unless necessary.

In each embodiment, a display device comprising an organic electroluminescent (EL) display element will be described as an example of a display device. However, each embodiment does not preclude application of individual technical ideas disclosed in the embodiment to display devices comprising various other display elements. Here, these display devices are, for example, a display device comprising a liquid crystal display element, an electronic-paper type display device comprising an electrophoresis element, and the like.

Firstly, the structure common among the embodiments will be described with reference to FIGS. 1 to 5.

FIG. 1 is a schematic plan view of a display device 1. The display device 1 includes a display panel 2. The display panel 2 includes a display area DA and a surrounding area SA which surrounds the display area DA. In the display area DA, pixels PX are arranged in a matrix. In the present embodiment, the pixel PX includes an organic EL element and a switching element (thin-film transistor). For example, the organic EL element includes a pixel electrode connected to the switching element, and an organic luminescent layer which emits light according to voltage between the pixel electrode and a common electrode provided across a plurality of pixels PX.

In the surrounding area SA, the display panel 2 includes vertical drivers 6L and 6R and a horizontal diver 7. In FIG. 1, the vertical driver 6L is formed along the left side of the display area DA, and the vertical driver 6R is formed along the right side of the display area DA. The horizontal driver 7 is formed along the lower side of the display area DA. Each of the drivers 6L, 6R and 7 is a peripheral circuit and drives each pixel PX under control of a driver IC 5.

The display panel 2 further includes a wiring area LA provided on the lower side of the horizontal driver 7 in the drawing, and wirings L1 and L2 formed in the wiring area LA. The wirings L1 and L2 are formed, for example, of a metal material. In the example shown in FIG. 1, three wirings L1 extend from each of the vertical drivers 6L and 6R, and numerous wirings L2 extend from the horizontal driver 7. For example, the wiring L1 is a power supply line which supplies a drive voltage to each of the vertical drivers 6L and 6R. For example, the wiring L2 is a signal line which supplies an image signal for driving each pixel PX. In addition to the wirings L1 and L2, another wiring may also be formed in the wiring area LA. The wiring area LA may also be referred to as an outer lead bonding (OLB) pad.

Each of the wirings L1 and L2 is arranged in an X direction (arrangement direction). Further, each of the wirings L1 and L2 extends in a Y direction (extension direction) either linearly or windingly. In the present embodiment, the X direction and the Y direction are orthogonal to each other in planar view. However, the X direction and the Y direction may cross each other at an angle other than a right angle.

Note that the direction (thickness direction of the display panel 2) orthogonal to the X direction and the Y direction is defined as a Z direction. Further, both sides of the wiring area LA arranged in the X direction will be referred to as a first side S1 and a second side S2, and both sides of the wiring area LA arranged in the Y direction will be referred to as a third side S3 and a fourth side S4. In the example shown in FIG. 1, the sides S1 and S2 correspond to the left and right short sides of the wiring area LA, and the sides S3 and S4 correspond to the upper and lower long sides of the wiring area LA. The third side S3 is located between the fourth side S4 and the display area DA.

The display device 1 further includes a first circuit board 3, a second circuit board 4, and the driver IC 5. In the vicinity of the fourth side S4, the first circuit board 3 is connected to the display panel 2, for example, via an anisotropic conductive film. The second circuit board 4 is connected to the first circuit board 3, for example, via an anisotropic conductive film. The first circuit board 3 and the second circuit board 4 are, for example, flexible printed circuits (FPCs). The driver IC 5 is a controller which controls each of the drivers 6L, 6R and 7 and is mounted on the first circuit board 3, for example, by a chip-on-film (COF) method. Note that, in the present embodiment, the first circuit board 3, the second circuit board 4, and the driver IC 5 correspond to external circuits.

Each wiring L1 is connected to the second circuit board 4 via the first circuit board 3. Each wiring L2 is connected to the driver IC 5 on the first circuit board 3. To the second circuit board 4, various signals and power are supplied from the controller of an electronic device on which the display device 1 is mounted.

The display panel 2 includes a flexible substrate 11. For example, the flexible substrate 11 includes the display area DA, the surrounding area SA, and the wiring area LA. As the flexible substrate 11, for example, a polyimide substrate can be used. Note that the flexible substrate 11 may be formed of various other resins. Note that, in the present embodiment, the flexible substrate 11 corresponds to a first substrate, the display area DA and the surrounding area SA correspond to a first area, and the wiring area LA corresponds to a second area.

The display device 1 having the above-described structure can be mounted on the electronic device, for example, in a state where the wiring area LA is folded. FIG. 2 is a schematic diagram showing a state where the wiring area LA is folded. The figure shows a cross-section of the display device 1 taken parallel to the Y-Z plane.

In the wiring area LA, the display panel 2 includes the flexible substrate 11, a wiring layer 30, and a protection layer 20. The wiring layer 30 is a layer which includes the above-described wirings L1 and L2 and is formed on the flexible substrate 11. The protection layer 20 is a layer which covers the wiring layer 30 and includes a protection film 21 which is formed of an insulating resin material. Note that, in addition to the wiring layer 30, another layer may be further provided between the flexible substrate 11 and the protection layer 20. Similarly, the protection layer 20 may further include another layer in addition to the protection film 21.

The display panel 2 has a first surface F1 and a second surface F2 which is opposite to the first surface F1. In the wiring area LA, the first surface F1 corresponds to the back surface of the flexible substrate 11, and the second surface F2 corresponds to the front surface of the protection layer 20. In the display area DA shown in FIG. 1, the second surface F2 corresponds to the display surface.

Note that, in the display area DA, various insulating layers, semiconductor layers, metal layers, pixel electrodes, common electrodes, organic luminescent layers, polarizing layers, and the like are arranged on the flexible substrate 11. These elements may partially extend in the wiring area LA shown in FIG. 2.

The first circuit board 3 is connected to the first surface F1 of the display panel 2. For example, as shown in the drawing, the wiring layer 30 (each of the wirings L1 and L2) is connected to the first circuit board 3 via a through hole 11a provided in the flexible substrate 11. Note that the first circuit board 3 may also be connected to the second surface F2 of the display panel 2.

In the wiring area LA, the display panel 2 is bent at 180 degrees in such a manner that the flexible substrate 11 will be placed on the inner side of the bend. At this time, the axis AX of the bending is, for example, parallel to the X direction. The display panel 2 may also be bent at another angle such as an angle of 90 degrees.

An adhesive layer 40 is formed between the first circuit board 3 and the first surface F1 of the display panel 2 which are opposed to each other. The first circuit board 3 and the first surface F1 are attached to each other by the adhesive layer 40, and the display panel 2 is maintained to be folded, accordingly. In the example shown in FIG. 2, a spacer 41 is supported by the adhesive layer 40. The end of the spacer 41 is smoothly rounded and is brought into contact with the first surface F1. As the spacer 41 is provided, the folded state of the wiring area LA can be stably maintained, and the curvature of the folded wiring area LA can be easily controlled.

In the following description, a part of the flexible substrate 11 located in the wiring area LA and having curvature will be referred to as a bend area BA. In the bend area BA, tensile stress and compressive stress are produced. The maximum tensile stress is applied to the second surface F2, and the maximum compressive stress is applied to the first surface F1. When the tensile stress or the compressive stress is applied to the wiring layer 30, there is a possibility of the wirings L1 and L2 of the wiring layer 30 being damaged and broken.

In the thickness direction of the display panel 2, there is a neutral plane where both of the above-described compressive stress and tensile stress are zero. If the wiring layer 30 is deviated from the neutral plane, stress σ to be applied to the wiring layer 30 can be represented as σ=E·ε  ε=E·h/ρ where E is a Young's modulus of the wiring layer 30, ε is a strain, h is a distance from the neutral plane to the wiring layer 30 in the radius direction, and ρ is a radius of curvature of the neutral plane.

It is possible to adjust the radius of curvature ρ of the neutral plane by adjusting the thicknesses of the flexible substrate 11 and the protection film 20. Therefore, if the thicknesses of the flexible substrate 11 and the protection layer 20 are determined such that the wiring layer 30 coincides with the neutral plane, the stress will not be applied to the wiring layer 30, and consequently the damage of the wirings L1 and L2 will be prevented.

However, it is difficult to align the conductive layer 30 with the neutral plane across the entire bend area BA. In particular, the central area and the peripheral area arranged in the direction along the bend axis AX (X direction) have different deformation characteristics, and in the peripheral area, the neutral plane tends to have a substantially smaller radius of curvature ρ. In this way, tensile stress is applied to the wiring layer 30 in the peripheral area, and the wirings L1 and L2 tend to be damaged by the stress.

In the embodiments which will be described later, to solve this problem, the thickness of the flexible substrate 11 or the protection layer 20 or the Young's modulus varies between the central area and the peripheral area of the bend area BA.

FIG. 3 is an explanatory diagram on the central area and the peripheral area and is a planar view of the wiring area LA. At the time of mounting the display device, as shown in FIG. 2, the wiring area LA is bent in the bend area BA.

In the example shown in FIG. 3, the wiring area LA includes an integration area IA in which the wirings L1 and the wirings L2 are integrated, respectively. In the integration area IA, a width W1 of a wiring group consisting of the wirings L1 and L2 decreases with increasing distance from the third side S3.

Outside the integration area IA, each of the wirings L1 and L2 extends parallel to the Y direction. On the other hand, in the integration area IA, each of the wirings L1 and L2 extends in a direction which crosses the Y direction (in the bend area BA, a direction C which is orthogonal to the bend axis AX) at an angle θ. The angle θ is an angle other than a right angle. For example, each of the wirings L1 and L2 closer to each of the sides S1 and S2 crosses at a larger angle θ, and each of the wirings L1 and L2 closer to the center in the X direction crosses at a smaller angle θ. The angle θ for the wirings L1 closest to the sides S1 and S2 should be an angle of 10 degrees or more and less than 90 degrees, more desirable, an angle of 30 degrees or more and less than 90 degrees.

In the example shown in FIG. 3, spaces are provided between the third side S3 and the integration area IA and between the fourth side S4 and the integration area IA, respectively. Note that one or both of these spaces may not be provided. If both of the spaces are not provided, the wirings L1 and L2 which are inclined at the angle θ with respect to the Y direction (C direction in the bend area BA) extend from the third side S3 to the fourth side S4.

In the example shown in FIG. 3, the wiring area LA includes a first peripheral area EA1 near the first side S2 and a second peripheral area EA2 near the second side S2. The area between these peripheral areas EA1 and EA2 corresponds to a central area CA. The first peripheral area EA1, the central area CA, and the second area EA2 are arranged in the X direction.

Each of the peripheral areas EA1 and EA2 overlaps the bend area BA. In the example shown in FIG. 3, each of the peripheral areas EA1 and EA2 overlaps each wiring L1 and also overlaps at least a part of each wiring L2. The above-described tensile stress tends to be applied to the wirings L1 closest to the sides S1 and S2. Therefore, the peripheral areas EA1 and EA2 should preferably overlap these wirings L1. However, it is also possible to avoid the peripheral areas EA1 and EA2 from overlapping the wirings L1 and L2.

The first peripheral area EA1 is in the range of a width W2 from the first side S1 in the X direction. Similarly, the second peripheral area EA2 is in the range of the width W2 from the second side S2 in the X direction. Note that the widths of the peripheral areas EA1 and EA2 may be different from each other.

For example, the width W2 is in the range of greater than or equal to 5% and less than or equal to 30% of a length L of the wiring area LA in the X direction. Further, the width W2 should preferably be in the range of greater than or equal to 10% and less than or equal to 30% of the length L, more desirable, greater than or equal to 15% and less than or equal to 25% of the length L. In the example shown in FIG. 3, spaces are provided between the peripheral areas EA1 and EA2 and the sides S3 and S4, respectively.

To reduce the stress to be applied to the wirings L1 and L2, it is preferable that the bend area BA should be set to be in a range where the wirings L1 and L2 are highly integrated, more desirably, a range where the wirings L1 and L2 are most highly integrated. Here, the degree of integration corresponds to the rate of change of the width W1 in the Y direction (or the C direction). A degree of integration can be represented as $\Delta w/\Delta c$ where $\Delta c$ is a length of the bend area BA in the C direction and $\Delta w$ is a change rate of the width W1 in an interval $\Delta c$. In the example shown in FIG. 3, the integration area IA has the highest degree of integration. Therefore, the bend area BA is set in such a way as to overlap the integration area IA.

Figure 4:
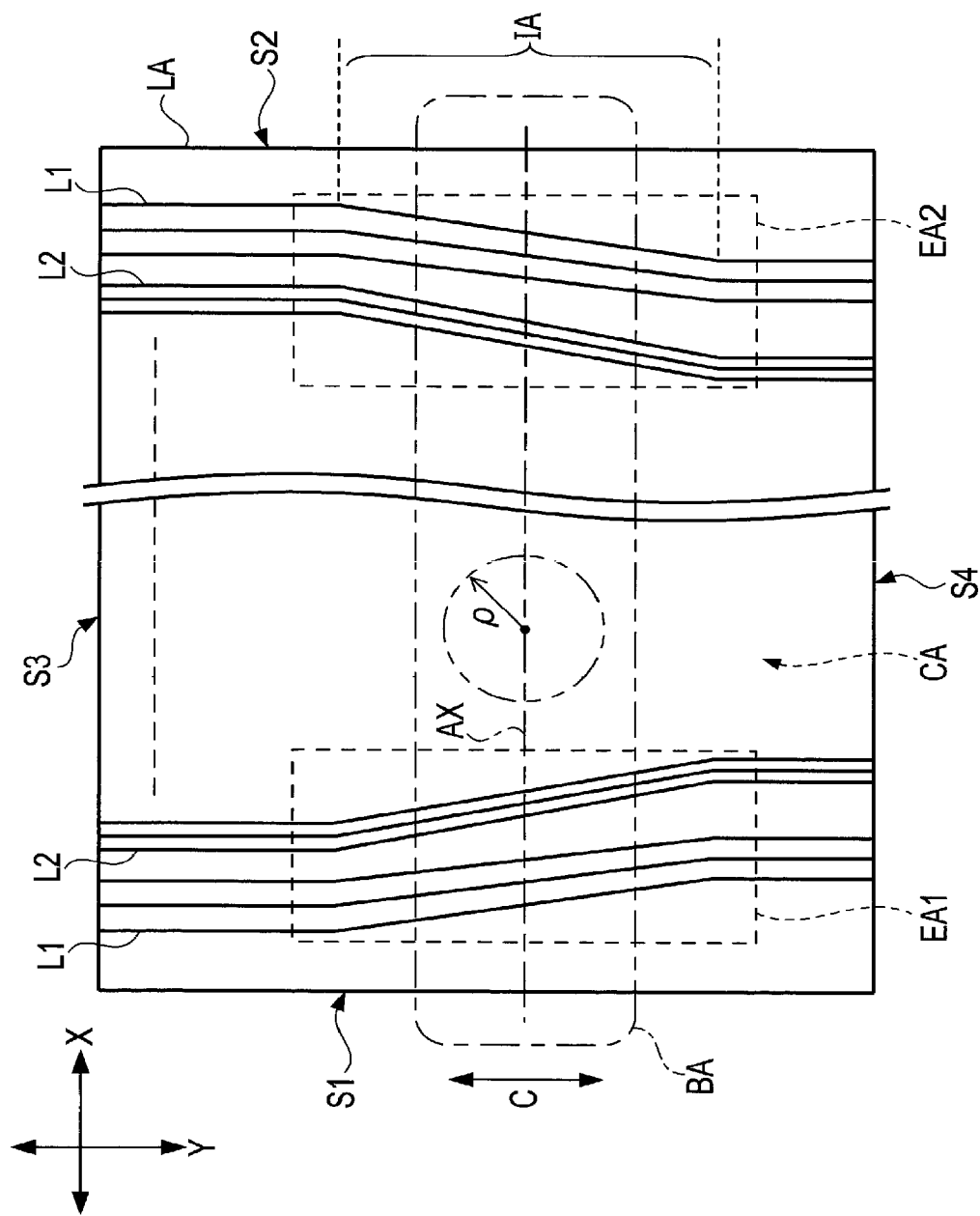
FIG. 4 is a plan view of another example of the wiring area.

FIG. 4 is a diagram showing another example of the peripheral areas EA1 and E2. In the example shown in the drawing, spaces are provided between the first side S1 and the first peripheral area EA1 and between the second side S2 and the second peripheral area EA2, respectively. The wiring L1 closest to the first side S1 overlaps the first peripheral area EA1, and the wiring L1 closest to the second side S2 overlaps the second peripheral area EA2.

Figure 5:
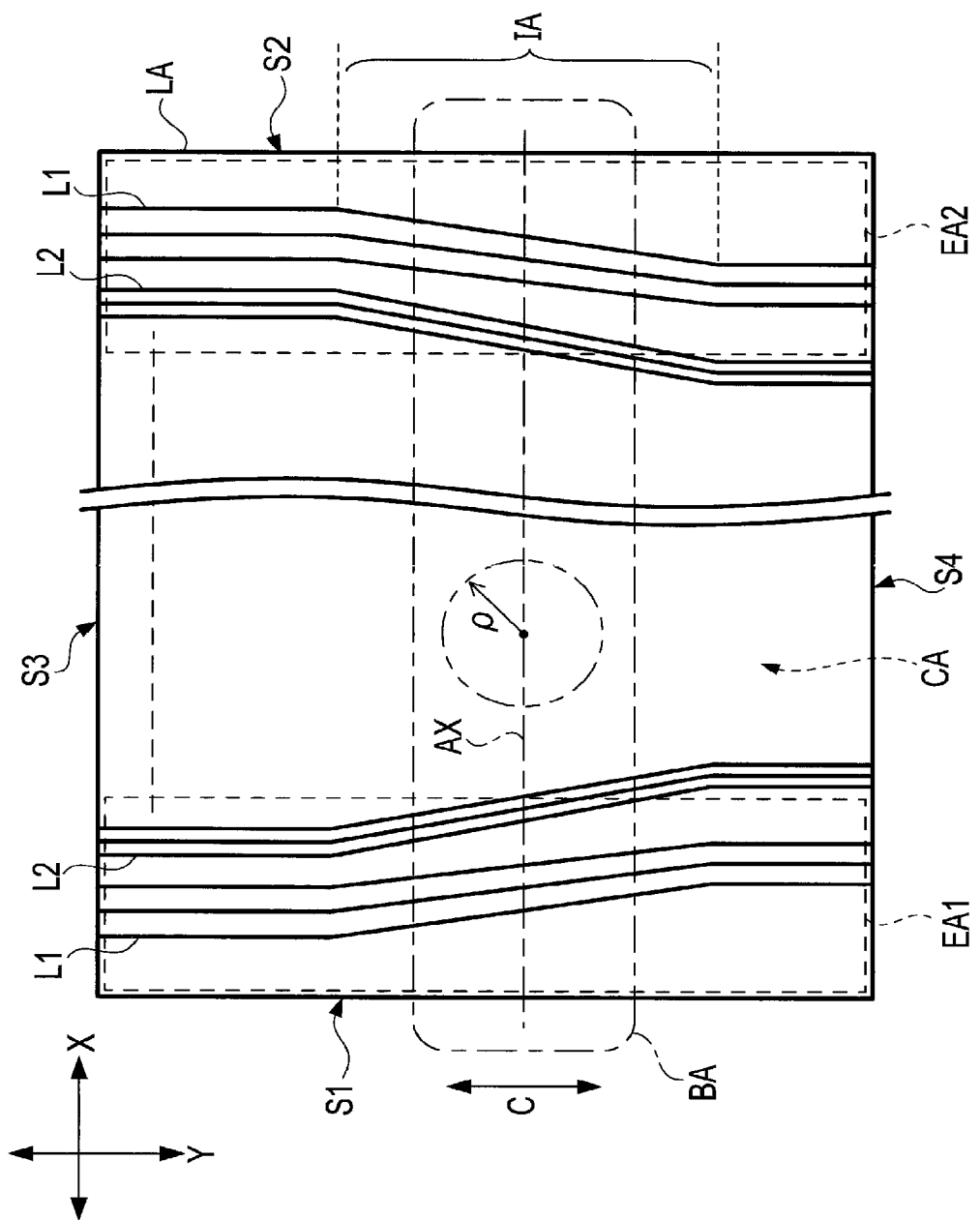
FIG. 5 is a plan view of yet another example of the wiring area.

FIG. 5 is a diagram showing yet another example of the peripheral areas EA1 and EA2. In the example shown in the drawing, no space is provided between the third side S3 and the peripheral areas EA1 and EA2 or between the fourth side S4 and the peripheral areas EA1 and EA2. That is, the peripheral areas EA1 and EA2 extend from the third side S3 to the fourth side S4. In this structure, as shown in FIG. 4, spaces may be provided further between the first side S1 and the first peripheral area EA1 and between the second side S2 and the second peripheral area EA2, respectively.

Hereinafter, embodiments applicable to the wiring area LA will be described in details.

First Embodiment

In the first embodiment, the thickness of the protection layer 20 varies between the central area CA and each of the peripheral areas EA1 and EA2. In the following description, an example applicable to the structure shown in FIG. 3 will be described, but any structure similar to that of the present embodiment is also applicable to the structures shown in FIGS. 4 and 5, and the like.

Figure 6:
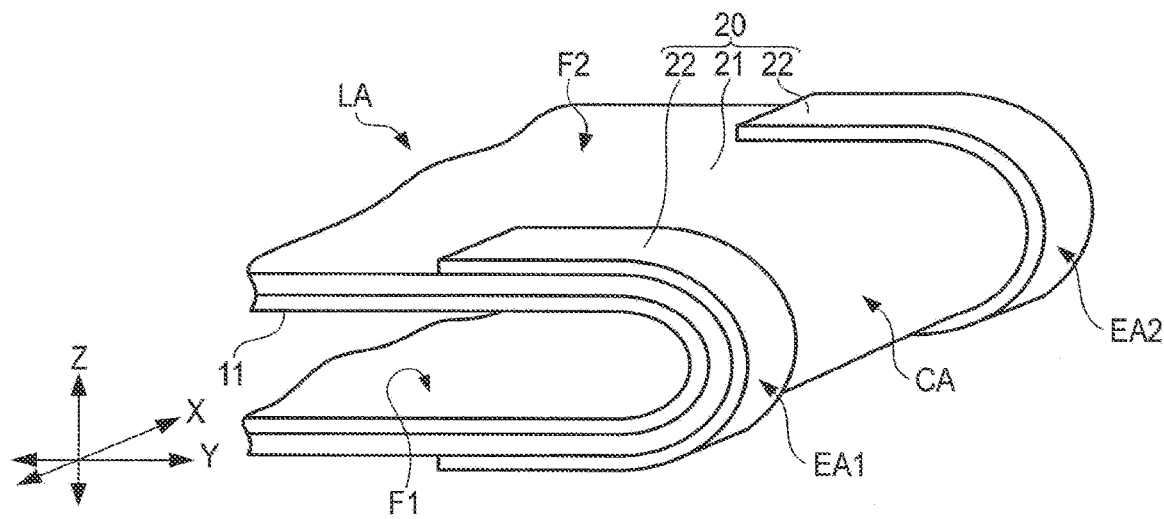
FIG. 6 is a schematic perspective view of a wiring area of a first embodiment.

FIG. 6 is a schematic perspective view of the wiring area LA of the first embodiment. In the present embodiment, the protection layer 20 includes two reinforcement films 22 in addition to the protection film 21. Each reinforcement film 22 is provided in each of the peripheral areas EA1 and EA2.

Figure 7:
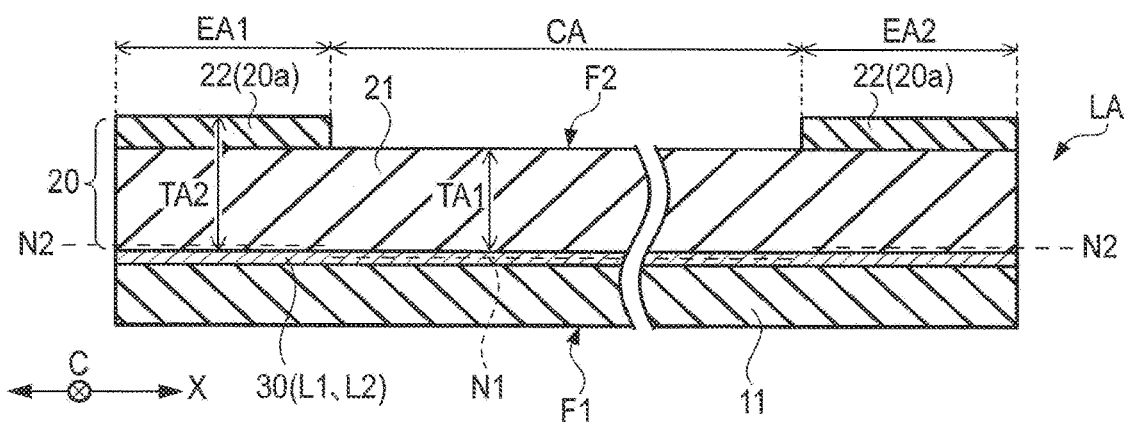
FIG. 7 is a sectional view of the wiring area of the first embodiment.
Figure 8:
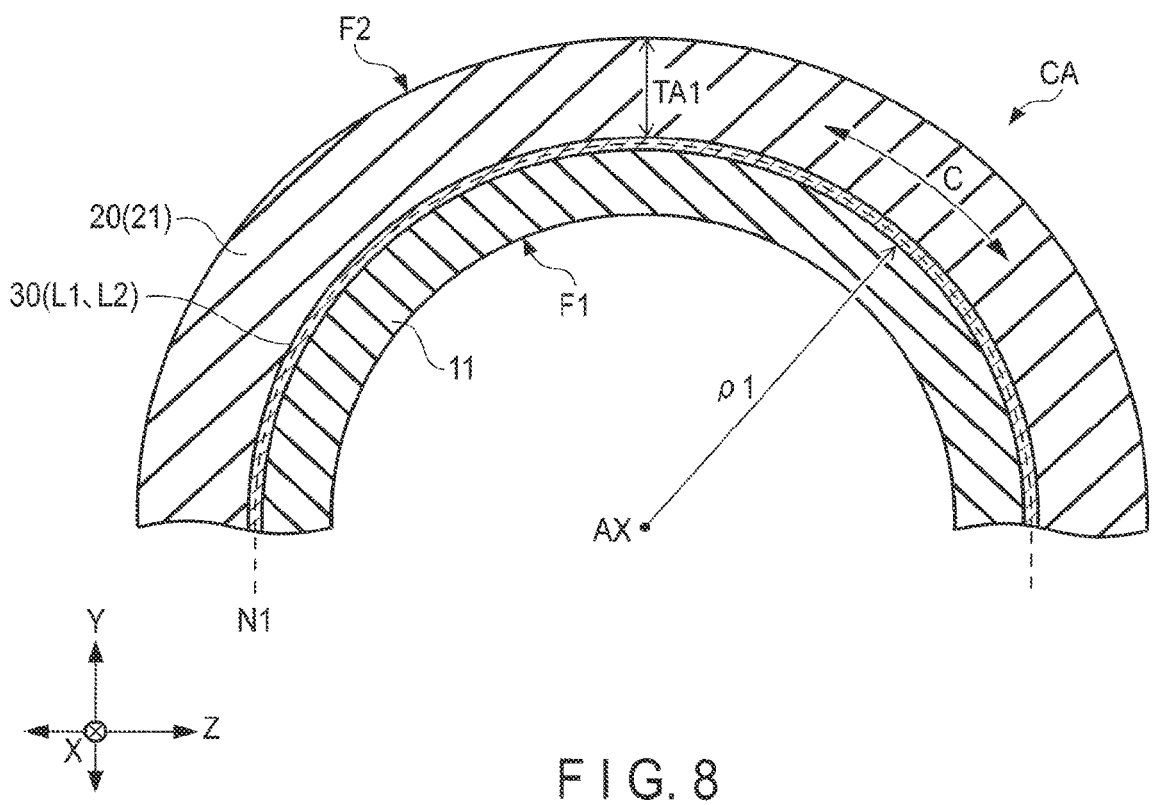
FIG. 8 is a sectional view of a central area of the wiring of the first embodiment.
Figure 9:
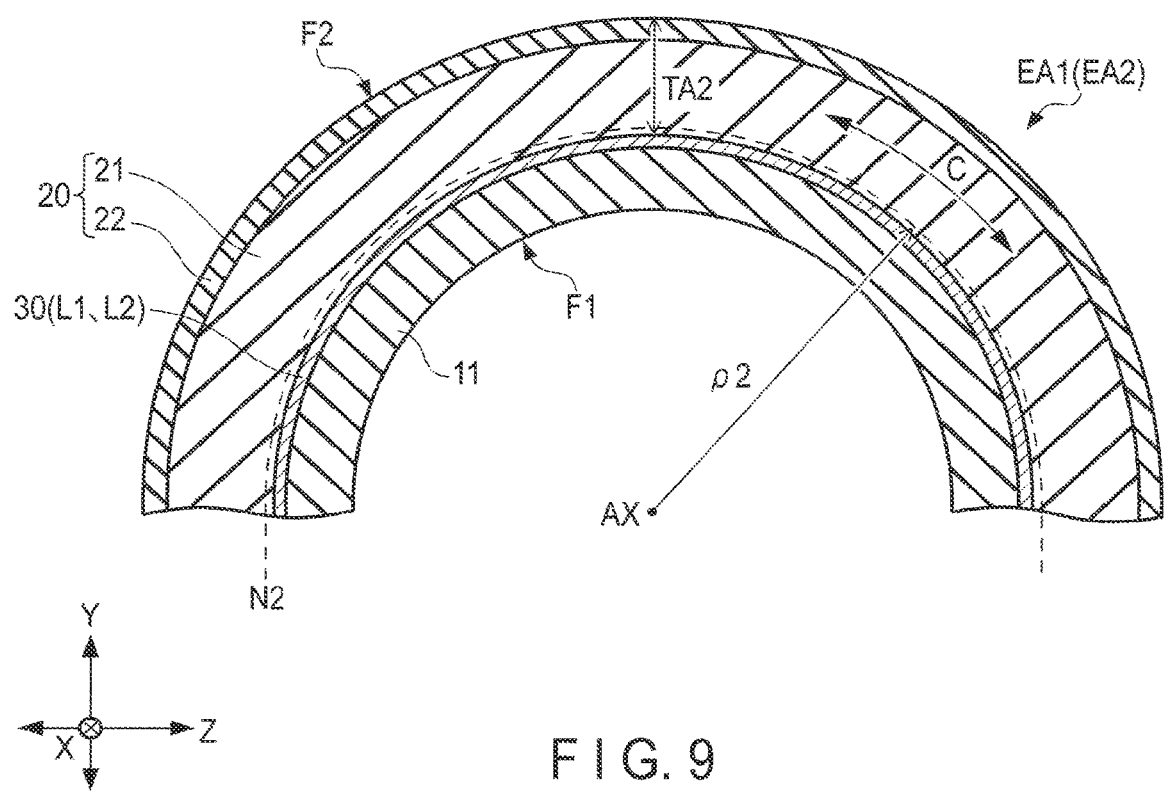
FIG. 9 is a sectional view of a peripheral area of the wiring area of the first embodiment.

FIG. 7 is a diagram showing a cross-section of the wiring area LA which is orthogonal to the C direction. FIG. 8 is a diagram showing a cross-section of the central area CA taken parallel to the Y-Z plane. FIG. 9 is a diagram showing a cross-section of the first peripheral area EA1 in the Y-Z plane. The second peripheral area EA2 has a structure similar to that of the first peripheral area EA1 shown in FIG. 9.

As shown in FIG. 7, each reinforcement film 22 is formed on the protection film 21. It is possible to form each reinforcement film 22, for example, by applying an ultraviolet curable resin material to the protection film 21 and then irradiating the resin with ultraviolet light to cure the resin. Each reinforcement film 22 may be attached to the protection film 21 via an adhesive layer. As an example, the material of the reinforcement film 22 is the same as that of the protection film 21. Note that the protection film 21 and the reinforcement film 22 may be formed of different materials from each other.

As shown in FIGS. 7 and 8, the thicknesses of the flexible substrate 11 and the protection layer 20 are determined such that, in the central area CA, a neutral plane N1 shown by dashed lines coincides with the wiring layer 30. In the central area CA, the radius of curvature of the neutral plane N1 is $\rho 1$, and the thickness (first thickness) of the protection layer 20 is TA1. In the example shown in FIG. 8, the thickness TA1 corresponds to the thickness of the protection film 21.

On the other hand, as shown in FIGS. 7 and 9, in each of the peripheral areas EA1 and EA2, the reinforcement film 22 is formed on the protection film 21. In this way, a thickness TA2 (second thickness) of the protection film 20 in each of the peripheral areas EA1 and EA2 becomes greater than the thickness TA1 by the reinforcement film 22 (TA2>TA1).

From another perspective, in each of the peripheral areas EA1 and EA2, the protection film 22 has a projection 20a which projects to the opposite side with respect to the wiring layer 30. In the present embodiment, the projection 20a corresponds to the reinforcement film 22, but the projection 20a may be formed as a part of the protection film 21. That is, it is also possible to form each projection 20a by making the protection film 21 relatively thinner in the central area CA.

In the present embodiment, since the thickness of the protection layer 20 increases by the reinforcement film 22, a neutral plane N2 in each of the peripheral areas EA1 and E2 shifts from the neutral plane N1 toward the second surface F2. Further, as the reinforcement film 22 is provided, each of the peripheral areas EA1 and EA2 becomes less flexible, and a radius of curvature $\rho 2$ of the neutral plane N2 becomes greater than the radius of curvature $\rho 1$ of the neutral plane N1 ($\rho 2 > \rho 1$).

The neutral plane N2 is closer to the second surface F2 than to the wiring layer 30. Therefore, basically, the tensile stress will not be applied to the wiring layer 30. Even if a manufacturing error occurs and the position of the neutral plane N2 shifts toward the first surface F1, the tensile stress is less likely to be applied to the wiring layer 30.

As described above, the deformation characteristics vary between the central area CA and each of the peripheral areas EA1 and EA2. Therefore, even if the neutral plane is designed in such a way as to be in the same position across the entire wiring area LA, the radius of curvature of the neutral plane tends to decrease in each of the peripheral areas EA1 and EA2, and the stress and the strain tend to increase, accordingly. In this case also, according to the structure of the present embodiment, since the tensile stress is less likely to be applied to the wiring layer 30 in each of the peripheral areas EA1 and EA2, the damage of each of the wirings L1 and L2 by the tensile stress can be prevented. Note that, in each of the peripheral areas EA1 and EA2, the compressive stress is likely to be applied to the wiring layer 30. However, regarding the resistance to breakage of a material, in general, the resistance to compressive stress is higher than the resistance to tensile stress. Therefore, each of the wirings L1 and L2 is less likely to be damaged by the compressive stress.

Further, it is possible to increase the radius of curvature of each of the peripheral areas EA1 and EA2 by providing the reinforcement film 21. Therefore, the stress and the strain in each of the peripheral areas EA1 and EA2 can be reduced, and consequently the risk of each of the wirings L1 and L2 being damaged can be further reduced.

Example 1

Now, Example 1 applicable to the structure shown in FIGS. 6 to 9 will be described. FIG. 10 is a diagram showing a layer structure in Example 1. As shown in the drawing, in Example 1, the wiring layer 30 is sandwiched by a pair of passivation layers. These passivation layers are inorganic films formed of, for example, SiN, SiO, or the like and protect the wiring layer 30 from oxidation, corrosion and the like. These passivation layers may be included in any layers.

Each of the wirings L1 and L2 of the wiring layer 30 has a multilayer structure where a titanium (Ti) layer having a thickness of 0.1 μm, an aluminum (Al) layer having a thickness of 0.5 μm, and a titanium layer having a thickness of 0.05 μm are stacked in this order. Each of the titanium layers has a Young's modulus of 107 GPa, and the aluminum layer has a Young's modulus of 70.3 GPa.

The passivation layer on the flexible substrate 11 has a thickness of 0.5 μm and a Young's modulus of 100 GPa. The flexible substrate 11 is a polyimide film which has a thickness of 15 μm and a Young's modulus of 8 GPa. The passivation layer on the wiring layer 30 has a thickness of 0.2 μm and a Young's modulus of 100 GPa.

As an acrylic resin is applied to the wiring layer 30 and the resin is then cured by ultraviolet light, the protection film 21 is formed. As the same acrylic resin as that of the protection film 21 is applied onto the protection film 21 and is then cured by ultraviolet light, the reinforcement film 22 is formed. The thickness of the protection film 21 is 60 μm, and the thickness of the reinforcement film 22 is 3 μm. The young's modulus of the protection film 21 and the reinforcement film 22 is 0.6 GPa.

According to the above-described structure, in the central area CA, the aluminum layer of the wiring layer 30 coincides with the neutral plane. Further, in each of the peripheral areas EA1 and EA2, the neutral plane shifts from the aluminum layer toward the reinforcement film 22. Note that the length L of the wiring area LA is 50 mm, and that the width W2 of each reinforcement film 22 (each of the peripheral areas EA1 and EA2) is 15 mm.

This wiring area LA is bent in a radius of curvature of about 0.5 mm. As a result, the wirings L1 and L2 are not damaged in either of the central area CA and each of the peripheral areas EA1 and EA2. Note that, when the reinforcement film 22 is not provided but the rest of the structure is the same as the above-described structure, and if the wiring area LA is bent in a radius of curvature of about 0.5 mm, the wirings of the wiring layer 30 in the vicinity of ends thereof are cracked, and some of them are broken. The above results show that the structure of the present embodiment can protect the wiring layer 30.

Note that the structure disclosed in the present embodiment can be appropriately modified. For example, as shown in FIG. 11, the front surface of each reinforcement film 22 may be smoothly-curved.

Further, in each of the peripheral areas EA1 and EA2, the thickness of the protection layer 20 may be changed in a stepwise manner. It is possible to realize such a structure, for example, by stacking a plurality of reinforcement films 22 which have different widths from each other.

Second Embodiment

In the second embodiment, the thickness of the flexible substrate 11 varies between the central area CA and each of the peripheral areas EA1 and EA2. In the following description, an example applicable to the structures shown in FIGS. 3 and 5 will be described, but a structure similar to that of the present embodiment is also applicable to the structure shown in FIG. 4, and the like.

Figure 13:
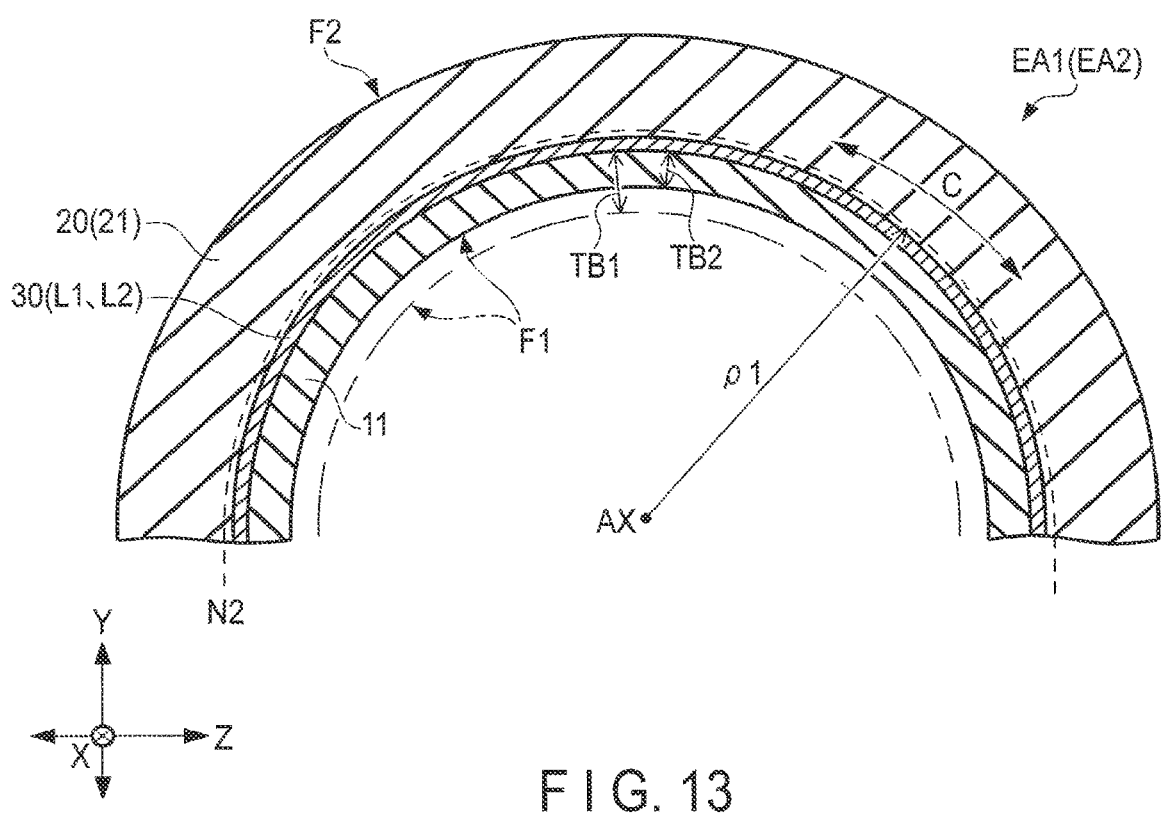
FIG. 13 is a sectional view of a peripheral area of the wiring area of the second embodiment.

FIG. 12 is a diagram showing a cross-section of the wiring area LA which is orthogonal to the C direction. FIG. 13 is a diagram showing a cross-section of the first peripheral area EA1 taken parallel to the Y-Z plane. In FIG. 13, the position of the first surface F1 in the central area CA is shown by alternate long and two short dashed lines. The second peripheral area EA1 has a structure similar to that of the first peripheral area EA1 shown in FIG. 13.

In the present embodiment, as shown in FIG. 12, the thickness of the flexible substrate 11 is reduced in each of the peripheral areas EA1 and EA2. That is, the thickness of the flexible substrate 11 is TB1 (third thickness) in the central area CA and is TB2 (fourth thickness) less than TB1 in each of the peripheral areas EA1 and EA2 (TB2<TB1). Each of the thicknesses TB1 and TB2 corresponds to the thickness of the flexible substrate 11.

From another perspective, the flexible substrate 11 has a projection 10*a* which projects to the side opposite to the wiring layer 30. Note that, although the projection 10*a* is a part of the flexible substrate 11 in the present embodiment, the projection 10*a* may be formed separately from the flexible substrate 11. In that case, for example, it is possible to attach the projection 10*a* to the flexible substrate 11 via an adhesive layer or apply an ultraviolet curable resin material to the flexible substrate 11 and then irradiate the resin with ultraviolet light to cure the resin.

Even when the thickness of the flexible substrate 11 is reduced in each of the peripheral areas EA1 and EA2, as in the case with the first embodiment, the neutral surface N2 in each of the peripheral areas EA1 and EA2 can be shifted toward the second surface F2. Therefore, when the wiring area LA is bent, the tensile stress is less likely to be applied to the wiring layer 30 in each of the peripheral areas EA1 and EA2, and the damage of each of the wirings L1 and L2 can be prevented.

Example 2

Now, Example 2 applicable to the structure shown in FIGS. 12 and 13 will be described. FIG. 14 is a diagram showing a layer structure in Example 2. Except for the absence of the reinforcement film 22 and the difference in the thickness of the flexible substrate 11, Example 2 has the same layer structure, film thickness, and Young's modulus as those of Example 1. Further, the length L of the wiring area LA is the same as that of Example 1, that is, 50 mm.

The thickness of the flexible substrate 11 is 15 µm in the central area CA and is 14 µm in each of the peripheral areas EA1 and EA2. That is, in Example 2, the thickness TB2 is one micrometer less than the thickness TB1. To reduce the film thickness of the flexible substrate 11, ablation using an ultraviolet laser is applied to each of the peripheral areas EA1 and EA2.

This wiring area LA is bent in a radius of curvature of about 0.5 mm. As a result, the wirings L1 and L2 are not damaged in either of the central area CA and each of the peripheral areas EA1 and EA2. Therefore, it is confirmed that the structure of the present embodiment can protect the wiring layer 30.

Note that the structure disclosed in the present embodiment can be appropriately modified. For example, in the same manner as that of each reinforcement film 22 shown in FIG. 11, the flexible substrate 11 may have a smoothly-curved surface in the vicinity of each of the peripheral areas EA1 and EA2. Alternatively, the thickness of the flexible surface 11 may be changed in a stepwise manner in each of the peripheral areas EA1 and EA2.

Third Embodiment

In the third embodiment, both the thickness of the flexible substrate 11 and the thickness of the protection layer 20 vary between the central area CA and each of the peripheral areas EA1 and EA2. In the following description, an example applicable to the structures shown in FIGS. 3 and 5 will be described, but a structure similar to that of the present embodiment is also applicable to the structure shown in FIG. 4, and the like.

Figure 15:
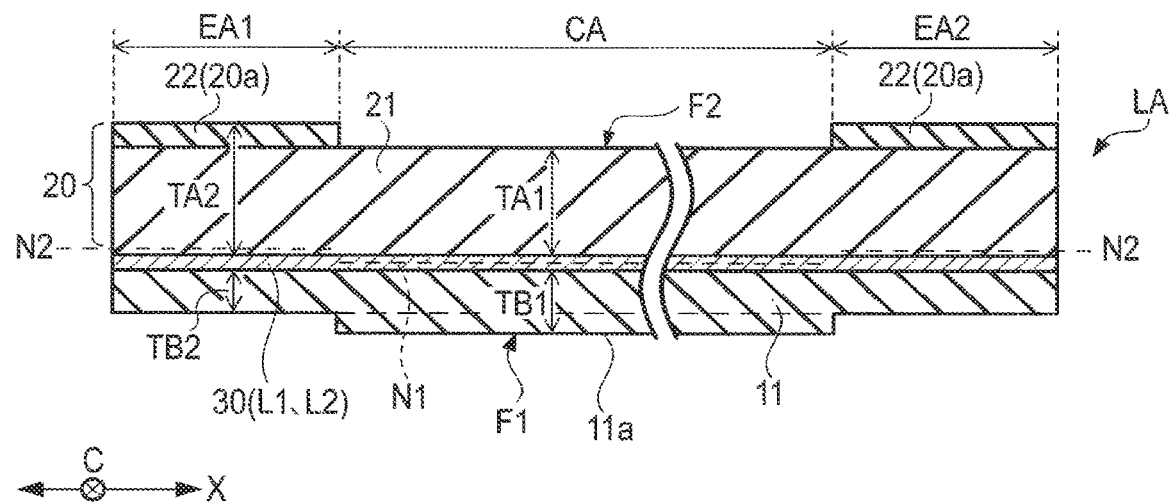
FIG. 15 is a sectional view of a wiring area of a third embodiment.

FIG. 15 is a diagram showing a cross-section of the wiring area LA which is orthogonal to the C direction. As in the case with the first embodiment, the reinforcement film 22 (projection 20*a*) is provided in each of the peripheral areas EA1 and EA2. Therefore, the thickness of the protection layer 20 is TA1 in the central area CA and is TA2 greater than TA1 in each of the peripheral areas EA1 and EA2.

Further, as in the case with the second embodiment, the thickness of the flexible substrate 11 is reduced in each of the peripheral areas EA1 and EA2. From another perspective, the flexible substrate 11 has the projection 10*a* in the central area CA. Therefore, the thickness of the flexible substrate 11 is TB1 in the central area CA and is TB2 less than TB1 in each of the peripheral areas EA1 and EA2.

As described above, in the case of adjusting both the thickness of the flexible substrate 11 and the thickness of the protection layer 20, effects the same as those obtained from the above-described embodiments can be obtained from the present embodiment. Further, according to the structure of the present embodiment, the amount of change in the thickness of each of the flexible substrate 11 and the protection layer 20 between the central area CA and each of the peripheral area EA1 and EA2 may be less than those of the first embodiment and the second embodiment.

Fourth Embodiment

In the fourth embodiment, the thicknesses of the flexible substrate 11 and the protection layer 20 is not adjusted, but the Young's modulus of the protection layer 20 varies between the central area CA and each of the peripheral areas EA1 and EA2. In the following description, an example applicable to the structures shown in FIGS. 3 and 5 will be described, but a structure similar to that of the present embodiment is also applicable to the structure shown in FIG. 4, and the like.

Figure 16:
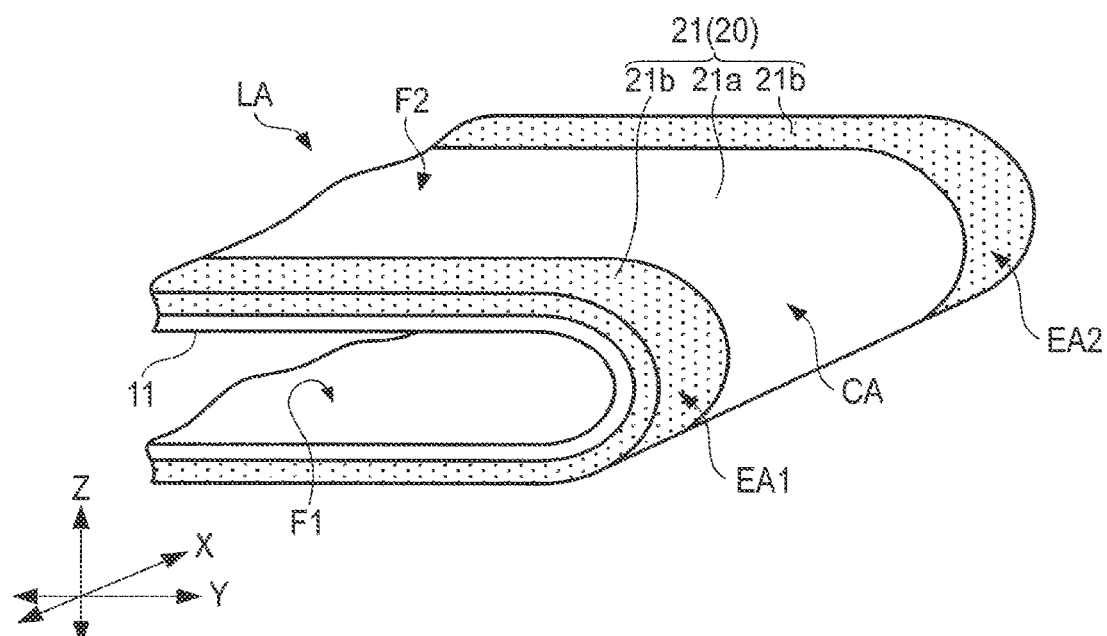
FIG. 16 is a schematic perspective view of a wiring area of a fourth embodiment.

FIG. 16 is a schematic perspective view of the wiring area LA of the fourth embodiment. In the present embodiment, the protection film 21 includes a first protection film 21*a* formed in the central area CA, and a second protection film 21*b* formed in each of the peripheral areas EA1 and EA2.

Figure 17:
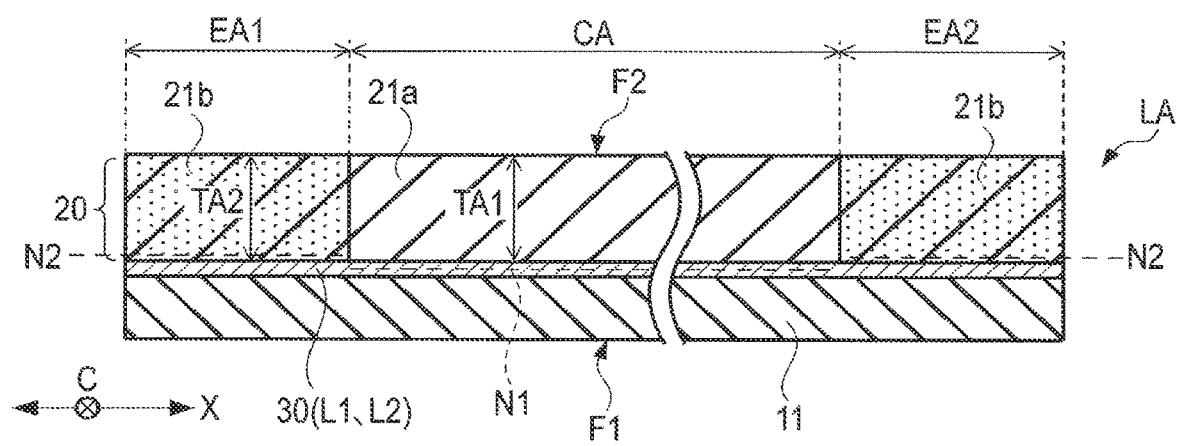
FIG. 17 is a sectional view of the wiring area of the fourth embodiment.

FIG. 17 is a diagram showing a cross-section of the wiring area LA which is orthogonal to the C direction. The thickness of the protection layer 20 in the central area CA (for example, the thickness of the first protection film 21*a*) is TA1, and the thickness of the protection layer 20 in each of the peripheral areas EA1 and EA2 (for example, the thickness of the second protection film 21*b*) is TA2. As an example, the thickness TA1 corresponds to the thickness of the first protection film 21*a*, and the thickness TA2 corresponds to the thickness of the second protection film 21*b*. In the example shown in FIG. 17, the thicknesses TA1 and TA2 are the same as each other. Note that the thicknesses TA1 and TA2 may be different from each other.

The Young's modulus of the first protection film 21*a* is less than the Young's modulus of the second protection film 21*b*. That is, a Young's modulus E1 (first Young's modulus) in the central area CA of the protection layer 20 is less than a Young's modulus E2 (second Young's modulus) in each of the peripheral areas EA1 and EA2 of the protection layer 20 (E2>E1). In this structure, as in the case with each of the above-described embodiments, the neutral plane N2 in each of the peripheral areas EA1 and EA2 is closer to the second surface F2 than the neutral plane N1 in the central area CA.

The position and curvature of the neutral plane rely on the multiplication product of the thickness and the Young's modulus of the protection layer 20. Further, if the position and curvature of the neutral plane vary significantly between the central area CA and each of the peripheral areas EA1 and EA2, it is difficult to control the stress to be applied to the wiring layer 30 within the preferable range across the entire wiring 30. In this regard, it is preferable that an inequality defined as E1×TA1≤E2×TA2 and an inequality defined as E2×TA2≤1.5×E1×TA1 should be satisfied.

The material for each of the first protection film 21*a* and the second protection film 21*b* can be appropriately selected in light of the film thickness and the Young's modulus.

In the structure of the present embodiment also, it is possible to reduce the risk of each of the wirings L1 and L2 of the wiring layer 30 being damaged by appropriately controlling the position of the neutral plane N2 in each of the peripheral areas EA1 and EA2.

Fifth Embodiment

The structure of the wiring area LA of the fifth embodiment is basically the same as the structure of the first embodiment which has been described with reference to FIGS. 6 to 9. However, in the present embodiment, the reinforcement film 22 is formed of a material having a Young's modulus greater than that of the protection film 21. In the same manner as that of the fourth embodiment, the material for each of the protection film 21 and the reinforcement film 22 can be appropriately selected in light of the film thicknesses and the Young's modulus.

In the structure of the present embodiment also, it is possible to reduce the risk of each of the wirings L1 and L2 of the wiring layer 30 being damaged by appropriately controlling the position of the neutral plane N2 in each of the peripheral areas EA1 and EA2.

Note that, in the structure of the third embodiment shown in FIG. 15, the Young's modulus of the reinforcement film 22 may be greater than the Young's modulus of the protection film 21.

The first to fifth embodiments can be appropriately combined with each other.

Further, each embodiment has been described based on the assumption that one wiring layer 30 is formed in the wiring area LA, but instead, a plurality of wiring layers 30 may be formed in such a manner that these wiring layers 30 are deviated from each other in the thickness direction of the wiring area LA. In that case, high tensile stress tends to be applied to the wiring layer 30 on the outer side of the bend. Therefore, it is possible to set the wiring layer 30 on the outer side of the bend as the control target for the neutral plane control by the method disclosed in each embodiment.

Further, in the fourth embodiment and the fifth embodiment, the cases of adjusting the Young's modulus of the protection layer 20 have been described by way of example. However, it is also possible to adjust the Young's modulus of the flexible substrate 11 to vary between the central area CA and each of the peripheral areas EA1 and EA2.

Still further, each of the above-described embodiments is based on the technical idea of reducing, in the case of folding the wiring area LA in such a manner that the flexible substrate 11 will be located on the inner side of the folded wiring area LA, the tensile stress to be applied to the wiring layer 30 in each of the peripheral areas EA1 and EA2. Each embodiment does not preclude various other applications of the technical ideas disclosed in the embodiment. For example, if it is necessary to make the tensile stress of the wiring layer 30 in the central area CA less than the tensile stress of the wiring layer 30 in each of the peripheral areas EA1 and EA2, the thickness TA1 of the protection layer 20 in the central area CA may be set to be greater than the thickness TA2 of the protection layer 20 in each of the peripheral areas EA1 and EA2. As another example, the thickness TB1 of the flexible substrate 11 in the central area CA may be set to be less than the thickness TB2 of the flexible substrate 11 in each of the peripheral areas EA1 and EA2. As yet another example, the Young's modulus of the protection layer 20 in the central area CA may be set to be greater than the Young's modulus of the protection layer 20 in each of the peripheral areas EA1 and EA2.

Still further, all display devices which a person having ordinary skill in the art can implement by making appropriate design changes to the display devices described in the embodiments of the present invention will come within the scope of the present invention as long as they fall within the scope and spirit of the present invention.

Still further, it is natural for a person having ordinary skill in the art to conceive of various modifications of the present invention within the scope of the technical concept of the present invention, and such modifications will be encompassed by the scope and spirit of the present invention. For example, the above-described embodiments with appropriate addition, deletion and/or design change of the structural elements, or appropriate addition, omission and/or condition change of the manufacturing process by a person having ordinary skill in the art will also come within the scope of the present invention as long as they fall within the scope and spirit of the present invention.

Still further, concerning advantages other than those described in the embodiments, advantages obvious from the description of the present invention and advantages appropriately conceivable by a person having ordinary skill in the art will be regarded as the advantages achievable from the present invention as a matter of course.

What is claimed is:

1. A display device comprising:
a first substrate including a first area including a display area in which pixels are arranged, a second area adjacent to the first area, and wirings; and
an external circuit mounted on the second area of the first substrate, wherein
the wirings are electrically connected to the external circuit,
the wirings in the second area are covered with a protection layer,
the second area includes first and second sides in an arrangement direction of the wirings, a central area located between the first and second sides, a first peripheral area located between the first side and the central area, and a second peripheral area located between the second side and the central area, and
a thickness of the protection layer in the central area is different from thicknesses of the protection layer in the first and second peripheral areas.

2. The display device of claim 1, wherein a first thickness of the protection layer in the central area is less than a second thickness of the protection layer in the first and second peripheral areas.

3. The display device of claim 2, wherein the protection layer includes a protection film covering the wirings in the first and second peripheral areas and the central area, and a reinforcement film provided in the first and second peripheral areas.

4. The display device of claim 1, wherein a third thickness of the first substrate in the central area is greater than a fourth thickness of the first substrate in the first and second peripheral areas.

5. The display device of claim 1, wherein the first substrate in the second area is bent along an axis parallel to the arrangement direction.

6. The display device of claim 1, wherein
the first peripheral area is provided in a range of a predetermined width from the first side, and
the second peripheral area is provided in a range of a predetermined width from the second side.

7. The display device of claim 1, wherein
a space is provided between the first peripheral area and the first side, and
a space is provided between the second peripheral area and the second side.

8. The display device of claim 1, wherein
the second area has a third side and a fourth side in an extension direction of the wirings, and
a space is provided between at least one of the first and second peripheral areas and either the third side or the fourth side.

9. The display device of claim 1, wherein
the second area has a third side and a fourth side in an extension direction of the wirings, and
at least one of the first and second peripheral areas extends from the third side to the fourth side.

10. The display device of claim 1, wherein a width of at least one of the first and second peripheral areas in the arrangement direction of the wirings is greater than or equal to 5% and less than or equal to 30% of a length of the second area in the arrangement direction.

11. A display device comprising:
a first substrate including a first area including a display area in which pixels are arranged, a second area adjacent to the first area, and wirings; and
an external circuit mounted on the second area of the first substrate, wherein
the wirings are electrically connected to the external circuit,
the wirings in the second area are covered with a protection layer,
the second area includes first and second sides in an arrangement direction of the wirings, a central area located between the first and second sides, a first peripheral area located between the first side and the central area, and a second peripheral area located between the second side and the central area
a first Young's modulus of the protection layer in the central area is less than a second Young's modulus of the protection layer in the first and second peripheral areas,
the protection layer has a first thickness in the central area and a second thickness in the first and second peripheral areas, and
an inequality defined as the first Young's modulus×the first thickness □ the second Young's modulus×the second thickness and an inequality defined as the second Young's modulus×the second thickness≤1.5× the first Young's modulus×the first thickness are satisfied.

12. The display device of claim 11, wherein the first substrate in the second area is bent along an axis parallel to the arrangement direction.

13. The display device of claim 11, wherein
the protection layer includes a protection film covering the wirings, and a reinforcement film provided in the first and second peripheral areas, and
a Young's modulus of the protection film and a Young's modulus of the reinforcement film are different from each other.

14. The display device of claim 11, wherein
the first peripheral area is provided in a range of a predetermined width from the first side, and
the second peripheral area is provided in a range of a predetermined width from the second side.

15. The display device of claim 11, wherein
a space is provided between the first peripheral area and the first side, and
a space is provided between the second peripheral area and the second side.

16. The display device of claim 11, wherein
the second area has a third side and a fourth side in an extension direction of the wirings, and
a space is provided between at least one of the first and second peripheral areas and either the third side or the fourth side.

17. The display device of claim 11, wherein
the second area has a third side and a fourth side in an extension direction of the wirings, and
at least one of the first and second peripheral areas extends from the third side to the fourth side.

18. The display device of claim 11, wherein a width of at least one of the first and second peripheral areas in the arrangement direction of the wirings is greater than or equal to 5% and less than or equal to 30% of a length of the second area in the arrangement direction.

* * * * *